United States Patent
Chung et al.

(10) Patent No.: US 10,177,042 B2
(45) Date of Patent: Jan. 8, 2019

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Won-Keun Chung, Seoul (KR); Hu-Yong Lee, Seoul (KR); Taek-Soo Jeon, Yongin-si (KR); Sang-Jin Hyun, Suwon-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/193,805

(22) Filed: Jun. 27, 2016

(65) Prior Publication Data
US 2017/0117190 A1     Apr. 27, 2017

(30) Foreign Application Priority Data
Oct. 21, 2015   (KR) .................. 10-2015-0146552

(51) Int. Cl.
| | |
|---|---|
| *H01L 27/092* | (2006.01) |
| *H01L 21/8238* | (2006.01) |
| *H01L 29/49* | (2006.01) |
| *H01L 29/66* | (2006.01) |
| *H01L 29/51* | (2006.01) |

(52) U.S. Cl.
CPC .... *H01L 21/823842* (2013.01); *H01L 27/092* (2013.01); *H01L 29/4966* (2013.01); *H01L 29/513* (2013.01); *H01L 29/66545* (2013.01)

(58) Field of Classification Search
CPC ....... H01L 21/823842; H01L 29/66545; H01L 29/4966; H01L 27/0922
See application file for complete search history.

(56) References Cited

U.S. PATENT DOCUMENTS

| | | | |
|---|---|---|---|
| 7,919,820 B2 | 4/2011 | Chung et al. | |
| 8,129,792 B2 | 3/2012 | Ichihara et al. | |
| 8,912,607 B2 | 12/2014 | Kwon et al. | |
| 8,932,923 B2 | 1/2015 | Kim et al. | |
| 8,946,026 B2 | 2/2015 | Choi et al. | |
| 9,041,118 B2 | 5/2015 | Ando et al. | |
| 9,131,442 B2 | 9/2015 | Hwang et al. | |
| 9,530,778 B1* | 12/2016 | Lin .................. | H01L 27/0922 |
| 2007/0173025 A1 | 7/2007 | Akamatsu | |

(Continued)

FOREIGN PATENT DOCUMENTS

| | | |
|---|---|---|
| JP | 2009-164207 A | 7/2009 |
| JP | 2013-026466 A | 2/2013 |

(Continued)

*Primary Examiner* — Dale E Page
*Assistant Examiner* — Wasiul Haider
(74) *Attorney, Agent, or Firm* — Lee & Morse, P.C.

(57) ABSTRACT

A semiconductor device includes a first trench and a second trench, a liner pattern along a portion of side surfaces and along bottom surfaces of the first and the second trenches, respectively, a work function metal in the first and the second trenches and on the liner pattern, respectively, a first barrier metal in the first trench and on the work function metal, and having a first thickness, a second barrier metal in the second trench and on the work function metal, and having a second thickness thicker than the first thickness, and a first fill metal on the first barrier metal.

19 Claims, 12 Drawing Sheets

(56) References Cited

U.S. PATENT DOCUMENTS

| | | | |
|---|---|---|---|
| 2011/0193180 A1* | 8/2011 | Chen | H01L 21/02148 257/411 |
| 2012/0153406 A1 | 6/2012 | Park et al. | |
| 2013/0026637 A1* | 1/2013 | Hou | H01L 21/28088 257/770 |
| 2014/0001565 A1* | 1/2014 | Choi | H01L 27/092 257/369 |
| 2014/0070307 A1* | 3/2014 | Ando | H01L 21/28088 257/330 |
| 2014/0374840 A1 | 12/2014 | Lee et al. | |
| 2015/0171086 A1 | 6/2015 | Cai et al. | |
| 2015/0349073 A1* | 12/2015 | Kang | H01L 21/28088 257/330 |
| 2015/0380407 A1* | 12/2015 | Ji | H01L 27/0922 257/369 |
| 2016/0254158 A1* | 9/2016 | Kim | H01L 21/28158 438/591 |
| 2017/0077256 A1* | 3/2017 | Adusumilli | H01L 29/4966 |

FOREIGN PATENT DOCUMENTS

| | | | |
|---|---|---|---|
| JP | 2015-060867 A | 3/2015 | |
| KR | 10-2009-0074522 A | 7/2009 | |
| KR | 10-2013-0105020 A | 9/2013 | |

* cited by examiner

SEMICONDUCTOR DEVICE AND METHOD FOR FABRICATING THE SAME

CROSS-REFERENCE TO RELATED APPLICATION

Korean Patent Application No. 10-2015-0146552, filed on Oct. 21, 2015, in the Korean Intellectual Property Office, and entitled: "Semiconductor Device and Method for Fabricating the Same," is incorporated by reference herein in its entirety.

BACKGROUND

1. Field

Embodiments of the present disclosure relate to a semiconductor device and a method for fabricating the same.

2. Description of the Related Art

The decrease in feature size of the MOS transistor has led into decrease in the gate length and the length of the channel. It is desired to increase capacitance between gates and channels, and to enhance operating characteristics of the MOS transistor.

Silicon oxide film is widely used for a gate insulating film, but as the silicon oxide film thickness decreases, there may be a physical limit in view of electric property. Accordingly, a high-k dielectric film having high dielectric constant may replace the silicon oxide film. The high-k dielectric film may reduce leakage current between gate electrode and channel region, while maintaining a thin equivalent oxide film thickness.

Further, polysilicon used as a gate material has greater resistance than many metals. Accordingly, a metal gate electrode may replace the polysilicon gate electrode.

SUMMARY

Embodiments are directed to a semiconductor device, including a first trench and a second trench, a liner pattern along a portion of side surfaces and along bottom surfaces of the first and the second trenches, respectively, a work function metal in the first and the second trenches and on the liner pattern, respectively, a first barrier metal in the first trench and on the work function metal, and having a first thickness, a second barrier metal in the second trench and on the work function metal, and having a second thickness thicker than the first thickness, and a first fill metal on the first barrier metal.

The semiconductor device may further include a second fill metal on the second barrier metal.

The semiconductor device may further include a first recess within the first barrier metal, wherein the first fill metal fills the first recess.

The semiconductor device may further include a second recess within the second barrier metal, and a second fill metal filling the second recess.

A width of the first recess may be wider than a width of the second recess.

A depth of the first recess may be greater than a depth of the second recess.

The semiconductor device may further include a first capping pattern on the first barrier metal and filling the first trench, and a second capping pattern on the second barrier metal and filling the second trench.

The semiconductor device may further include a high-k dielectric film in the first and the second trenches and under the liner pattern.

In the first trench, the high-k dielectric film may contact the liner pattern and the first barrier metal.

The high-k dielectric film may contact the work function metal.

In the first trench, the high-k dielectric film may not contact the first fill metal.

The semiconductor device may further include a rare earth metal film between the liner pattern and the high-k dielectric film.

The rare earth metal film may include one or more of LaO, $Y_2O_3$, or LaSiO.

The liner pattern may include a lower liner pattern, and an upper liner pattern on the lower liner pattern.

Embodiments are also directed to a semiconductor device, including a first trench and a second trench, a liner pattern along a portion of side surfaces and along bottom surfaces of the first and the second trenches, respectively, a work function metal in the first and the second trenches and on the liner pattern, respectively, a barrier metal in the first and the second trenches and on the work function metal, and a fill metal on the barrier metal, wherein a volume of the fill metal in the first trench is greater than a volume in the second trench.

A first volume of the work function metal and the fill metal in the first trench combined may be equal to a second volume of the work function metal and the fill metal in the second trench combined.

The fill metal may include a first fill metal in the first trench and a second fill metal in the second trench, a width of the first fill metal being greater than a width of the second fill metal.

The fill metal may include a first fill metal in the first trench and a second fill metal located in the second trench, a height of the first fill metal being greater than a height of the second fill metal.

The barrier metal may include one or more of Ti or Ta.

The barrier metal may include one or more of TiN, TaN, TiTaN, or TiTaCN.

The fill metal may include one or more of W, WN, Al, AlF, Ru, or Co.

The liner pattern may include one or more of TiN, TaC, TaN, TiSiN, TaTiN, or TaSiN.

Embodiments are also directed to a semiconductor device including a first gate and a second gate adjacent to one another on a substrate. The first gate may include a first liner pattern in a U-shape, a first work function metal on the first liner pattern, a first barrier metal on the first work function metal and having a lower surface higher than an upper surface of the first liner pattern, and a first fill metal on the first barrier metal. The second gate may include a second liner pattern in a U-shape, a second work function metal on the second liner pattern, and a second barrier metal on the second work function metal and having a lower surface higher than an upper surface of the second liner pattern.

The first work function metal may be in a T-shape and separate the first barrier metal and the first liner pattern from each other.

The lower surface of the first barrier metal may contact the upper surface of the first liner pattern and an upper surface of the first work function metal.

The first gate may include a first recess surrounded by a first liner pattern, the first work function metal may partially fill the first recess, and the first barrier metal may entirely fill the first recess.

The first gate and the second gate may have different conductivity types from each other.

The first gate may be an N type, and the first work function metal may include one or more of TiN or TaN.

The second gate may be a P type, and the second work function metal may include one or more of TiAl, TiAlC, or TiAlN.

A thickness of the first barrier metal may be thinner than a thickness of the second barrier metal.

A thickness of the first work function metal and a thickness of the second work function metal may be different from each other.

Embodiments are also directed to a method for fabricating a semiconductor device, the method including forming a first trench and a second trench, forming a liner along a portion of side surfaces and along bottom surfaces of the first and the second trenches, respectively, and, forming, on the liner, a work function metal that partially fills the first and the second trenches, respectively, forming a first barrier metal having a first thickness in the first trench and on the work function metal, forming a second barrier metal having a second thickness thicker than the first thickness in the second trench and on the work function metal, and forming a first fill metal on the first barrier metal.

The method may further include forming a first dummy gate electrode and a second dummy gate electrode, forming a first spacer and a second spacer on sidewalls of the first and the second dummy gate electrodes, respectively, and forming the first and the second trenches, respectively, by removing the first and the second dummy gate electrodes.

The method may further include forming a high-k dielectric film along side surfaces and bottom surfaces of the first and the second trenches; and forming the liner on the high-k dielectric film.

Forming the liner may include forming the liner along side surfaces and bottom surfaces of the first and the second trenches, forming, on the liner, an etch-stop film for partially filling the first and the second trenches, and etching the liner so that an upper surface of the etch-stop film and an uppermost portion of an upper surface of the liner are in a same plane.

Embodiments are also directed to a method for fabricating a semiconductor device, the method including forming a first trench and a second trench, forming a liner along side surfaces and bottom surfaces of the first and the second trenches, forming a work function metal in the first and the second trenches and on the liner, partially evacuating the first and the second trenches, respectively, by etching the work function metal, forming a pre barrier metal of a first thickness in the first and the second trenches, removing the pre barrier metal from the first trench, forming a first barrier metal in the first and the second trenches, while forming, in the second trench, the pre barrier metal and a second barrier metal including the first barrier metal, and forming a first fill metal on the first barrier metal.

The method may include forming a second fill metal on the second barrier metal. A thickness of the second fill metal may be thinner than a thickness of the first fill metal.

Forming the first pre barrier metal may include one or more of atomic layer deposition (ALD), chemical vapor deposition (CVD), physical vapor deposition (PVD), or low pressure chemical vapor deposition (LPCVD).

Embodiments are also directed to a semiconductor device, including a substrate, the substrate having a first gate structure and a second gate structure, the first gate structure including a first fill layer and a first work function layer with a first barrier layer interposed therebetween, a first portion of the first barrier layer that is interposed between the first fill layer and the first work function layer having a first thickness, the first work function layer having a second thickness adjacent the first portion of first barrier layer, and the first fill layer having a third thickness adjacent to the first portion of first barrier layer, and the second gate structure including a second work function layer with a second barrier layer thereon, a first portion of the second barrier layer that is on the second work function layer having a fourth thickness, the second work function layer having a fifth thickness adjacent to the first portion of second barrier layer. The first, second, and third thicknesses may have a combined thickness that is substantially equal to a combined thickness of the fourth and fifth thicknesses. The second gate structure may further includes a second fill layer on the second barrier layer, the second fill layer having a sixth thickness adjacent to the first portion of the second barrier layer, and the first, second, and third thicknesses may have a combined thickness that is substantially equal to a combined thickness of the fourth, fifth, and sixth thicknesses.

The first through sixth thicknesses may be determined in a direction normal to the substrate.

The first and third thicknesses may have a combined thickness that is substantially equal to a combined thickness of the fourth and sixth thicknesses.

One of the first gate structure and the second gate structure may be part of a PMOS transistor, the other of the first gate structure and the second gate structure may be part of an NMOS transistor, and the first thickness B1 may be different from the fourth thickness B2.

The first work function layer and the second work function layer may each independently include one or more of TiN, TaN, TiAl, TiAlN, TaC, TiC, or HfSi, the first barrier layer and the second barrier layer may each independently include one or more of, for example, Ti, Ta, TiN, TaN, TiTaN, or TiTaCN, the first fill layer and the second fill layer may each independently include one or more of W, WN, Al, AlF, Ru, or Co, and the first work function layer may have a different composition from the first barrier layer, and the second work function layer may have a different composition from the second barrier layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
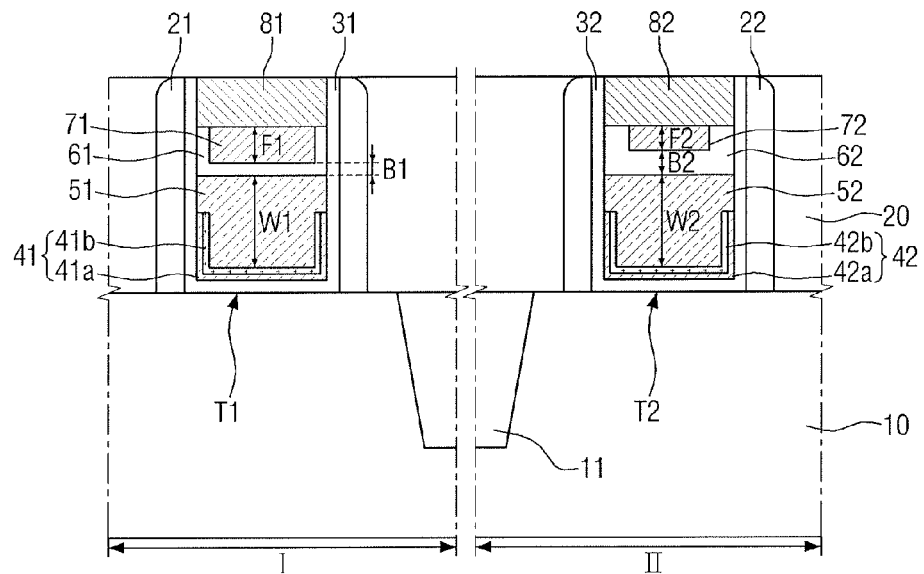
FIG. 1 illustrates a cross sectional view provided to explain a semiconductor device according to some example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that when an element or layer is referred to as being "connected to," or "coupled to" another element or layer, it can be directly connected to or coupled to another element or layer, or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc., may be used herein to describe various elements, these elements should not be limited by these terms. These terms are only used to distinguish one element from another element. Thus, for example, a first element, a first component, or a first section discussed below could be termed a second element, a second component, or a second section without departing from the teachings of the present disclosure.

The use of the terms "a," "an," and "the," and similar referents in the context of the disclosure (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

Hereinbelow, a semiconductor device according to example embodiments will be explained with reference to FIGS. 1 and 2.

Figure 2:
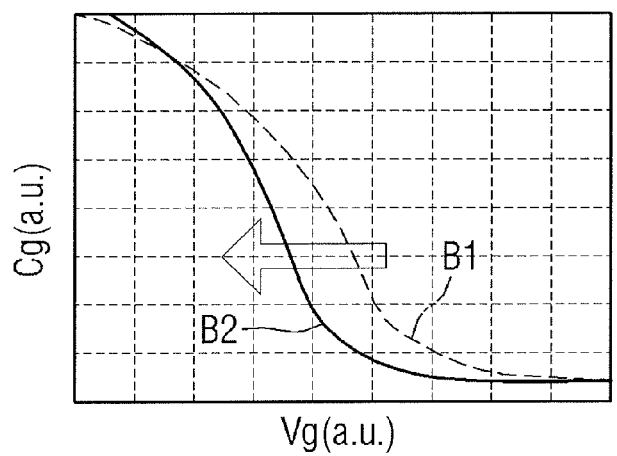
FIG. 2 illustrates a graphical representation provided to explain threshold voltage of a semiconductor device according to some example embodiments.

FIG. 1 is a cross sectional view provided to explain a semiconductor device according to some example embodiments, and FIG. 2 is a graphical representation provided to explain threshold voltage of a semiconductor device according to some example embodiments.

Referring to FIGS. 1 and 2, a semiconductor device according to example embodiments includes a substrate 10, a device isolation film 11, an interlayer insulation film 20, spacers 21, 22, high-k dielectric films 31, 32, liner patterns 41, 42, work function metals 51, 52, barrier metals 61, 62, fill metals 71, 72, and capping patterns 81, 82.

The substrate 10 may be a bulk silicon or a silicon-on-insulator (SOI), for example. In another implementation, the substrate 10 may be a silicon substrate, or may include other substance such as silicon germanium, indium antimonide, lead telluride compound, indium arsenide, indium phosphide, gallium arsenide, or gallium antimonide. In another implementation, the substrate 10 may be a base substrate having an epitaxial layer formed thereon.

The substrate 10 may include a first region I and a second region II. The first region I and the second region II may be connected with each other, or separated from each other. For example, the first region I may be an NFET region where an N-type transistor is formed, and the second region II may be a PFET region where a P-type transistor is formed, or vice versa, although example embodiments are not limited thereto. For example, the first region I and the second region II may both be the NFET regions or the PFET regions.

The substrate 10 according to example embodiments may include not only a planar transistor, but also a fin-type pattern or wire-type pattern transistor. In this case, the fin-type pattern may include an element semiconductor material such as silicon or germanium, for example. Further, the substrate 10 may include a compound semiconductor, such as, for example, IV-IV group compound semiconductor or III-V group compound semiconductor.

For example, take the IV-IV group compound semiconductor for instance, the fin-type pattern may be a binary compound or a ternary compound including at least two or more of carbon (C), silicon (Si), germanium (Ge), or tin (Sn), or the above-mentioned binary or ternary compound doped with IV group element.

Take a III-V group compound semiconductor for instance, the fin-type pattern may be one of a binary compound, ternary compound and quaternary compound which is formed by a combination of one or more of aluminum (Al), gallium (Ga), or indium (In) as a III group element, with one of phosphorus (P), arsenic (As) and antimony (Sb) as a V group element.

The device isolation film 11 may define an active region of the substrate 10. Thus, different active regions may be separated by the device isolation film 11. According to example embodiments, the first region I and the second region II of the substrate 10 may be separated from each other by the device isolation film 11.

The device isolation film 11 may include an insulating film. For example, the device insulating film 11 may include one or more of, for example, silicon oxide, silicon nitride, silicon oxynitride, or a low-k dielectric material with a smaller dielectric constant than silicon oxide. For example, the low-k dielectric material may include flowable oxide (FOX), Tonen silazen (TOSZ), undoped silica glass (USG), borosilica glass (BSG), phosphosilica glass (PSG), boro-phosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The interlayer insulation film 20 may be formed on the substrate 10 and the device isolation film 11. The interlayer insulation film 20 may include a first trench T1 in the first region I, and a second trench T2 in the second region II. The interlayer insulation film 20 may be formed by stacking two or more insulating films. As illustrated, the first spacer 21 and the second spacer 22 may be respectively formed on sidewalls of the first trench T1 and the second trench T2, respectively, and the substrate 10 may be disposed on bottom surfaces of the first trench T1 and the second trench T2. However, example embodiments are not limited to the example given above.

For example, the interlayer insulation film 20 may include one or more of, for example, silicon oxide, silicon nitride, silicon oxynitride, or a low-k dielectric material with a smaller dielectric constant than silicon oxide.

The first spacer 21 may form a sidewall of the first trench T1. For example, the first spacer 21 may include one or more of, for example, silicon nitride (SiN), silicon oxynitride (SiON), silicon dioxide ($SiO_2$), silicon oxycarbonitride (SiOCN), or a combination thereof.

The second spacer 22 may form a sidewall of the second trench T2. For example, the second spacer 22 may include one or more of, for example, silicon nitride (SiN), silicon oxynitride (SiON), silicon dioxide ($SiO_2$), silicon oxycarbonitride (SiOCN), or a combination thereof.

The first high-k dielectric film 31 may be conformally formed along the sidewall and the bottom surface of the first trench T1. The first high-k dielectric film 31 may entirely cover the sidewall of the first trench T1. Thus, the height of the uppermost portion of the upper surface of the first high-k dielectric film 31 may be same as the height of the upper surface of the first spacer 21. However, example embodiments are not limited to the example given above.

The second high-k dielectric film 32 may be conformally formed along the sidewall and the bottom surface of the second trench T2. The second high-k dielectric film 32 may entirely cover the sidewall of the second trench T2. Thus, the height of the uppermost portion of the upper surface of the second high-k dielectric film 32 may be same as the height of the upper surface of the second spacer 22. However, example embodiments are not limited to the example given above.

The first high-k dielectric film 31 and the second high-k dielectric film 32 may include a high-k dielectric material having a higher dielectric constant than a silicon oxide film. For example, the high-k dielectric films 31, 32 may include a material selected from the group of HfSiON, $HfO_2$, $ZrO_2$, $Ta_2O_5$, $TiO_2$, $SrTiO_3$, $(Ba,Sr)TiO_3$, and so on. Such high-k dielectric films 31, 32 may be formed to a suitable thickness depending on a type of the device intended to be formed.

Although not illustrated in FIG. 1, in some example embodiments, an interface film may be included between the high-k dielectric films 31, 32 and the substrate 10. The interface film may be formed along the bottom surfaces of the trenches T1, T2. The interface film may play a role of preventing a defective interface between the substrate 10 and the high-k dielectric films 31, 32. The interface film may include a low dielectric material layer having a dielectric constant (k) of 9 or lower, such as a silicon oxide film (k is approximately 4) or a silicon oxynitride film (k is approximately 4 to 8 depending on content of oxygen element and nitrogen element). In another implementation, the interface film may be formed of silicate, or a combination of films exemplified above.

The first liner pattern 41 may be formed in the first trench T1. The first liner pattern 41 may be formed on the first high-k dielectric film 31. The first liner pattern 41 may be formed along the upper surface of the first high-k dielectric film 31. The upper surface of the first high-k dielectric film 31 may be formed along the bottom surface and the side surface of the first trench T1, and accordingly, the first liner pattern 41 may also have such a shape that it is formed along the bottom surface and the side surface of the first trench T1.

The first liner pattern 41 may cover only a portion of the upper surface of the first high-k dielectric film 31. Thus, the first liner pattern 41 may be formed along only a portion of the side surface of the first trench T1. Accordingly, the first liner pattern 41 may be formed into a U-shape, but the uppermost portion of the upper surface of the first liner pattern 41 may be formed lower than the uppermost portion of the upper surface of the first high-k dielectric film 31.

The second liner pattern 42 may be formed in the second trench T2. The second liner pattern 42 may be formed on the second high-k dielectric film 32. The second liner pattern 42 may be formed along the upper surface of the second high-k dielectric film 32. The upper surface of the second high-k dielectric film 32 may be formed along the bottom surface and the side surface of the second trench T2, and accordingly, the second liner pattern 42 may also have such a shape that it is formed along the bottom surface and the side surface of the second trench T2.

The second liner pattern 42 may cover only a portion of the upper surface of the second high-k dielectric film 32. Thus, the second liner pattern 42 may be formed along only a portion of the side surface of the second trench T2. Accordingly, the second liner pattern 42 may be formed into a U-shape, but the uppermost portion of the upper surface of the second liner pattern 42 may be formed lower than the uppermost portion of the upper surface of the second high-k dielectric film 32.

The first liner pattern 41 and the second liner pattern 42 may include one or more of, for example, TiN, TaC, TaN, TiSiN, TaTiN, or TaSiN.

The first liner pattern 41 and second liner pattern 42 may be formed into a same shape as each other. The expression "same" as used herein indicates forming by the same process and also refers to a concept that encompasses minute differences.

The first liner pattern 41 may include a first lower liner pattern 41a and a first upper liner pattern 41b. The first lower liner pattern 41a may be formed conformally on the first high-k dielectric film 31, and the first upper liner pattern 41b may be formed conformally on the first lower liner pattern 41a. The first lower liner pattern 41a and the first upper liner pattern 41b may be etched by the same process so that the uppermost portions of the upper surfaces thereof have a same level as each other.

The first lower liner pattern 41a may include TiN, for example, and may be formed into a suitable thickness depending on a type of device intended to be formed. The first upper liner pattern 41b may include TaN, for example, and may be formed into a suitable thickness depending on a type of device intended to be formed. As illustrated in FIG. 1, the first lower liner pattern 41a and the first upper liner pattern 41b may be separated from each other, but the two patterns may be formed as one single film.

The second liner pattern 42 may include a second lower liner pattern 42a and a second upper liner pattern 42b. The second lower liner pattern 42a may be formed conformally on the second high-k dielectric film 32, and the second upper liner pattern 42b may be formed conformally on the second lower liner pattern 42a. The second lower liner pattern 42a and the second upper liner pattern 42b may be etched by the same process so that the uppermost portions of the upper surfaces thereof have a same level as each other.

The second lower liner pattern 42a may include TiN, for example, and may be formed into a suitable thickness depending on a type of device intended to be formed. The second upper liner pattern 42b may include TaN, for example, and may be formed into a suitable thickness depending on a type of device intended to be formed.

The first work function metal 51 may be formed in the first trench T1 so as to partially fill the first trench T1. The first work function metal 51 may be formed on the first high-k dielectric film 31 and the first liner pattern 41. The first work function metal 51 may be formed so as to cover the upper surface of the first liner pattern 41. As illustrated, the first work function metal 51 may be formed into a T-shape. Thus, a lower portion of the side surface of the first work function metal 51 may contact the first liner pattern 41, but an upper portion of the side surface of the first work function metal 51 may contact the first high-k dielectric film 31.

The second work function metal 52 may be formed in the second trench T2 so as to partially fill the second trench T2. The second work function metal 52 may be formed on the second high-k dielectric film 32 and the second liner pattern 42. The second work function metal 52 may be formed so as to cover the upper surface of the second liner pattern 42. As illustrated, the second work function metal 52 may be formed into a T-shape. Thus, a lower portion of the side surface of the second work function metal 52 may contact the second liner pattern 42, but an upper portion of the side surface of the second work function metal 52 may contact the second high-k dielectric film 32.

The first work function metal 51 and the second work function metal 52 may have the same shape, and may include the same material as each other. In this case, the first work function metal 51 and the second work function metal 52 play a role of adjusting work function of the transistor. The first work function metal 51 and the second work function metal 52 may be, for example, an N-type work function metal, a P-type work function metal, or a combination thereof. The first work function metal 51 and the second work function metal 52 may be a material selected from the group of TiN, TaN, TiAl, TiAlN, TaC, TiC, and HfSi, for example.

A first barrier metal 61 may be formed in the first trench T1 so as to partially fill the first trench T1. The first barrier metal 61 may be formed conformally along a portion of the sidewall of the first trench T1 and along the upper surface of the first work function metal 51. The first barrier metal 61 may include a recess which will be filled with a first fill metal 71 later. Further details regarding forming the recess are set forth below. The first barrier metal 61 may include one or more of, for example, Ti, Ta, TiN, TaN, TiTaN, or TiTaCN.

The second barrier metal 62 may be formed in the second trench T2 so as to partially fill the second trench T2. The second barrier metal 62 may be formed conformally along a portion of the sidewall of the second trench T2 and along the upper surface of the second work function metal 52. The second barrier metal 62 may include a recess which will be filled with a second fill metal 72 later. Further details regarding forming the recess are set forth below. The second barrier metal 62 may include one or more of, for example, Ti, Ta, TiN, TaN, TiTaN, or TiTaCN.

The first fill metal 71 may fill, for example, completely fill, the recess in the first barrier metal 61. The first fill metal 71 may be formed on the first barrier metal 61. The height of the upper surface of the first fill metal 71 may be at a same level as the height of the uppermost portion of the upper surface of the first barrier metal 61.

A second fill metal 72 may fill, for example, completely fill, the recess in the second barrier metal 62. The second fill metal 72 may be formed on the second barrier metal 62. The height of the upper surface of the second fill metal 72 may be at a same level as the height of the uppermost portion of the upper surface of the second barrier metal 62.

The fill metals 71, 72 may include one or more of, for example, W, WN, Al, AlF, Ru, or Co. In the present example embodiment, the fill metals 71, 72 are materials that have lower resistance than the nitride such as TiN, and may help to form low resistance of the gate electrode of the transistor.

The thickness (B1) of the first barrier metal 61 may be thinner than the thickness (B2) of the second barrier metal 62. The thicknesses B1 and B2 may be determined in a height direction. The thickness (F1) of the first fill metal 71 may be thicker than the thickness (F2) of the second fill metal 72. The thicknesses F1 and F2 may be determined in a height direction. The area and/or volume occupied by the first barrier metal 61 and the first fill metal 71 may be same as the area and/or volume occupied by the second barrier metal 62 and the second fill metal 72. For example, the sum of heights B1+F1 may be the same as B2+F2. In an implementation, the fill metals 71, 72 may become relatively thicker as the barrier metals 61, 62 become relatively thinner. For example, a combined thickness of fill metal 71 and barrier metal 61 may be substantially equal to a combined thickness of fill metal 72 and barrier metal 62.

Referring to FIG. 2, in the present example embodiment, the threshold voltage of the transistor may decrease as the thicknesses B1, B2 of the barrier metals 61, 62 become thicker. In FIG. 2, the horizontal axis represents the gate voltage of a PMOS transistor with respect to thickness B1 and thickness B2 of the barrier metals 61, 62, and the vertical axis represents the capacitance in the gate direction of the PMOS transistor according to thickness B1 and thickness B2 of the barrier metals 61, 62.

When the thickness of the barrier metals 61, 62 increase from B1 to B2, the flatband voltage may rise, thus resulting in increased threshold voltage. Thus, the threshold voltage may be adjusted according to thickness adjustment of the thicknesses B1, B2 of the barrier metals 61, 62.

The adjusting materials within the work function metals 51, 52 may combine with precursor materials of the fill metals 71, 72. Thus, the precursor materials formed for deposition of the fill metals 71, 72 may cross the barrier metals 61, 62 to combine with the adjusting materials within the work function metals 51, 52. Such combining of the precursor materials with the adjusting materials within the work function metals 51, 52 may cause the threshold voltage of the transistor to change.

For example, the work function metals 51, 52 may include work function adjusting materials within the work function metals 51, 52, and the threshold voltage of the transistor may vary depending on the degree of activation of such adjusting materials. The degree of activation of the adjusting materials of the work function metals 51, 52 may be adjusted as the adjusting materials of the work function metals 51, 52 are combined with the precursors of the fill metals 71, 72 as described above. Thus, the threshold voltage may be less adjusted as there is more combining between the precursors of the fill metals 71, 72 and the adjusting materials of the work function metals 51, 52.

Accordingly, the thicknesses B1, B2 of the barrier metals 61, 62 may be used to adjust the degree of combining between the precursors of the fill metals 71, 72 and the adjusting materials of the work function metals 51, 52. Thus, as thicknesses B1, B2 of the barrier metals 61, 62 become thicker, it may make it more difficult for the precursors of the fill metals 71, 72 and the adjusting materials of the work function metals 51, 52 to combine with each other. Accordingly, for a PFET, as a thicknesses B1, B2 of the barrier metals 61, 62 become thicker, it may make it more difficult for the precursors of the fill metals 71, 72 and the adjusting materials of the work function metals 51, 52 to combine, resulting in stronger adjustment of the work function metals 51, 52. As a result, the threshold voltage may be relatively increased. In contrast, the threshold voltage may be decreased for an NFET.

As the thicknesses B1, B2 of the barrier metals 61, 62 become thinner, it may make it easier for the precursors of the fill metals 71, 72 and the adjusting materials of the work function metals 51, 52 to combine with each other. Accordingly, for a PFET, as a thickness of the barrier metals 61, 62 becomes thinner, it may make it easier for the precursors of the fill metals 71, 72 and the adjusting materials of the work function metals 51, 52 to combine, resulting in weaker adjustment of the work function metals 51, 52. As a result, the threshold voltage can be relatively decreased. In contrast, the threshold voltage may be increased for an NFET.

The capping patterns 81, 82 may be formed on the barrier metals 61, 62 and the fill metals 71, 72. The capping patterns 81, 82 may fill, for example, entirely fill, the first trench T1 and the second trench T2. The side surfaces of the capping patterns 81, 82 may contact the high-k dielectric films 31, 32. The capping patterns 81, 82 may include, for example, silicon nitride, but are not limited thereto.

As illustrated in FIG. 1, the second fill metal 72 may be present. In other example embodiments, the second fill metal 72 may not be included, while the first fill metal 71 is present. Thus, in some examples, the thickness B2 of the second barrier metal 62 may increase compared to the thickness B1 of the first barrier metal 61, thus leaving no space, for example, no recess, for the second fill metal 72 to form in. For example, the thickness F2 may be zero and the sum of thicknesses B1 and F1 may be the same as B2.

According to the present example embodiment, it may be possible to adjust the threshold voltage of the transistor with accuracy by adjusting the thicknesses B1, B2 of the barrier metals 61, 62 which are at a relatively farther distance away from the high-k dielectric films 31, 32, instead of the work function metals 51, 52 at a relatively closer distance to the high-k dielectric films 31, 32. Thus, it may be possible to prevent damage to the high-k dielectric films 31, 32 during patterning, and also to set more accurate threshold voltage.

Hereinbelow, some example embodiments will be described with reference to FIG. 3. Elements or operations overlapping with those described above with reference to the semiconductor device of FIGS. 1 and 2 will be mentioned as briefly as possible or omitted for the sake of brevity.

Figure 3:
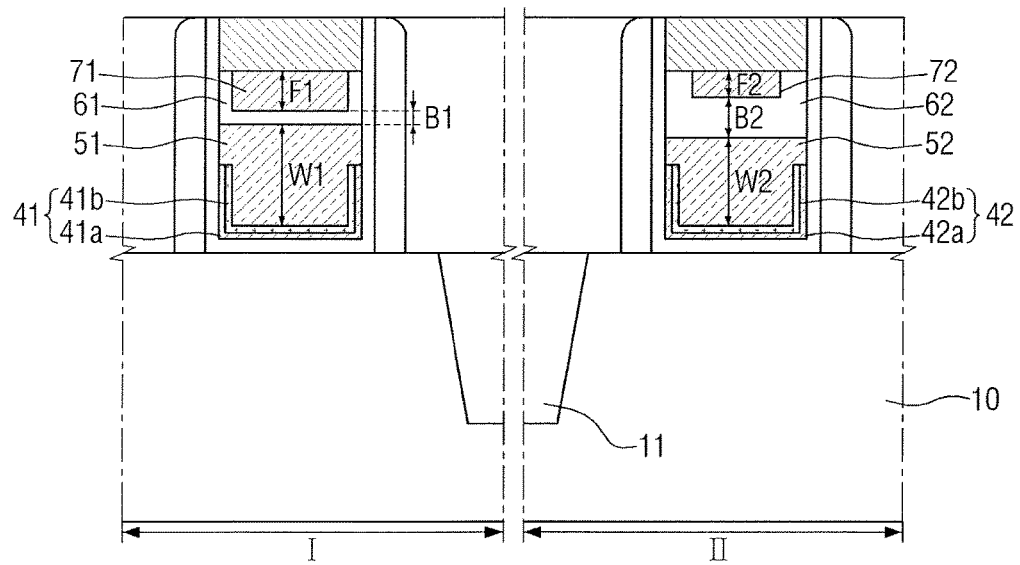
FIG. 3 illustrates a cross sectional view provided to explain a semiconductor device according to some example embodiments.

FIG. 3 is a cross sectional view provided to explain a semiconductor device according to some example embodiments.

Referring to FIG. 3, the thickness W1 of the first work function metal 51 and the thickness W2 of the second work function metal 52 may be different from each other. However, in other embodiments, for example, referring to FIG. 1, the thickness W1 of the first work function metal 51 may be substantially equal to the thickness W2 of the second work function metal 52. The threshold voltage of the transistor may be adjusted according to the thicknesses W1, W2 of the work function metals 51, 52 and the thicknesses B1, B2 of the barrier metals 61, 62. Thus, using two variable factors (for example, thicknesses W1 and B1, and/or thicknesses W2 and B2), more accurate threshold voltage setting may be achieved. Further, adjusting thicknesses W1, W2 of the work function metals 51, 52 may provide greater threshold voltage changes compared to adjusting thicknesses B1, B2 of the barrier metals 61, 62. Accordingly, it may be possible to perform more accurate threshold voltage setting by performing approximate threshold voltage setting based on the thicknesses W1, W2 of the work function metals 51, 52, and then performing additional thickness adjusting of the thicknesses B1, B2 of the barrier metals 61, 62. In an implementation, the sum of thicknesses W1+B1+F1 may be the same as, i.e., substantially equal to, the sum of thicknesses W2+B2+F2.

Hereinbelow, some example embodiments will be described with reference to FIG. 4. Elements or operations overlapping with those described above with reference to the semiconductor device of FIG. 1 will be mentioned as briefly as possible or omitted for the sake of brevity.

Figure 4:
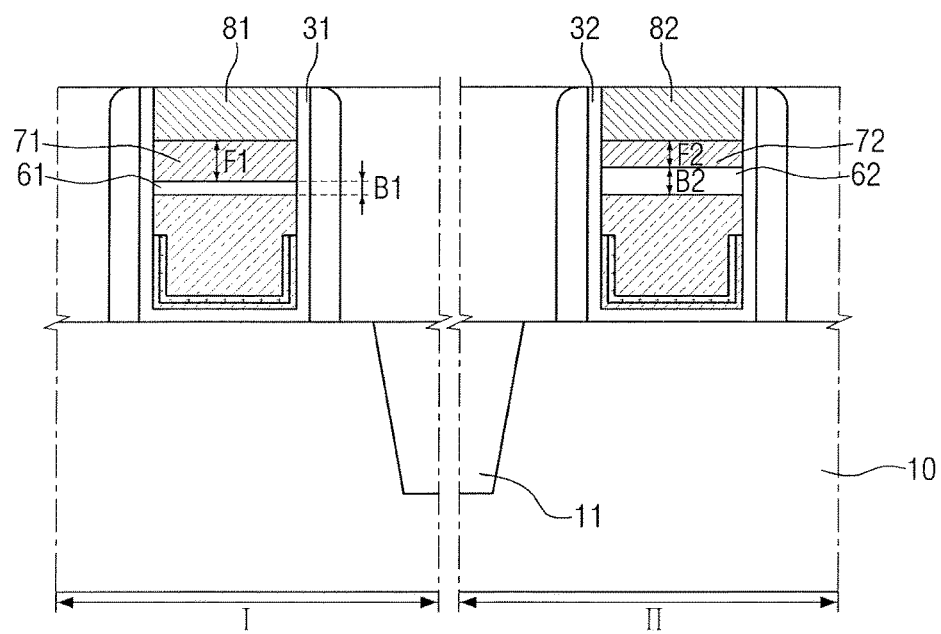
FIG. 4 illustrates a cross sectional view provided to explain a semiconductor device according to some example embodiments.

FIG. 4 is a cross sectional view provided to explain a semiconductor device according to some example embodiments.

Referring to FIG. 4, the first barrier metal 61 may partially fill the first trench T1. In this case, the first barrier metal 61 may be in a flat shape, rather than a U-shape. Thus, the upper surface of the first barrier metal 61 may be at a same level. Accordingly, the first fill metal 71 may be formed on the first barrier metal 61, and have a constant thickness F1.

The second barrier metal 62 may partially fill the second trench T2. In this case, the second barrier metal 62 may be in flat shape, rather than U-shape. Thus, the upper surface of the second barrier metal 62 may be at a same level. Accordingly, the second fill metal 72 may be formed on the second barrier metal 62, and have a constant thickness F2.

According to some example embodiments, the barrier metals 61, 62 do not form a recess. Accordingly, the fill metals 71, 72 may be formed using a process that helps prevent generating air gaps and also efficiently fills the first trench T1 and the second trench T2. Thus, processing error may be minimized.

Hereinbelow, some example embodiments will be described with reference to FIG. 5. Elements or operations overlapping with those described above with reference to the semiconductor device of FIGS. 1 to 4 will be mentioned as briefly as possible or omitted for the sake of brevity.

Figure 5:
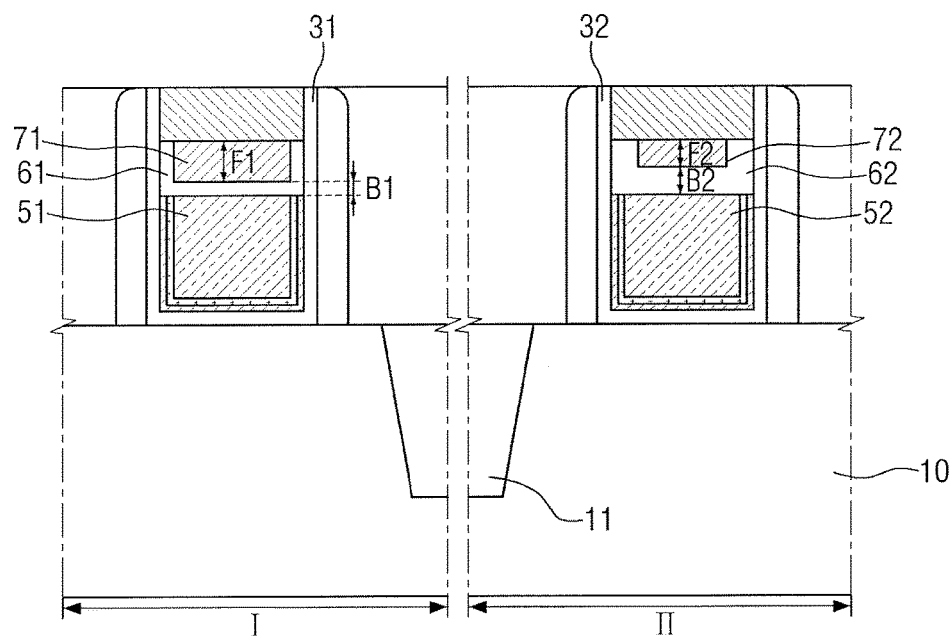
FIG. 5 illustrates a cross sectional view provided to explain a semiconductor device according to some example embodiments.

FIG. 5 is a cross sectional view provided to explain a semiconductor device according to some example embodiments.

Referring to FIG. 5, the uppermost portion of the upper surface of the liner patterns 41, 42 and the upper surfaces of the work function metals 51, 52 may be at a same level.

Thus, rather than T-shape, the work function metals 51, 52 may have a shape that has a straight side surface.

According to example embodiments, a semiconductor device with enhanced performance can be provided by performing patterning of the liner patterns 41, 42 and the work function metals 51, 52 at once, thus reducing waste in processing, and also minimizing damage to the high-k dielectric films 31, 32 underneath.

Hereinbelow, some example embodiments will be described with reference to FIG. 6. Elements or operations overlapping with those described above with reference to the semiconductor device of FIGS. 1 to 5 will be mentioned as briefly as possible or omitted for the sake of brevity.

Figure 6:
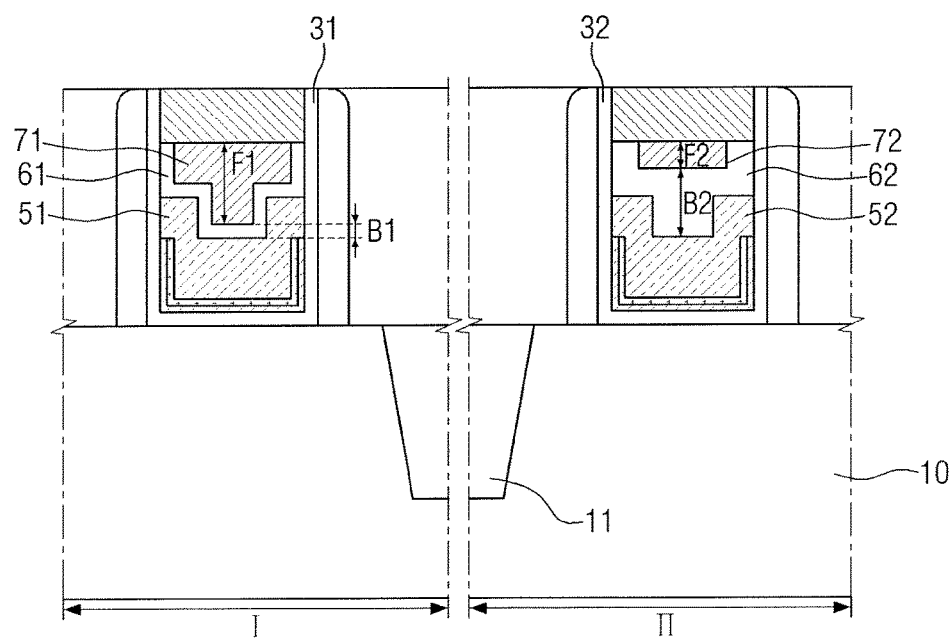
FIG. 6 illustrates a cross sectional view provided to explain a semiconductor device according to some example embodiments.

FIG. 6 is a cross sectional view provided to explain a semiconductor device according to some example embodiments.

Referring to FIG. 6, the work function metals 51, 52 may be formed conformally along the upper surfaces of the liner patterns 41, 42. Accordingly, the barrier metals 61, 62 may also be formed conformally along the upper surfaces of the work function metals 51, 52. Next, the fill metals 71, 72 may be formed into T-shape in order to fill the portions left unfilled by the barrier metals 61, 62.

According to example embodiments, since the work function metals 51, 52 are formed in a relatively thinner thickness, the area or the volume of the barrier metals 61, 62 and the fill metals 71, 72 may be relatively increased. Accordingly, the adjustment range of threshold voltage may be enlarged.

Hereinbelow, some example embodiments will be described with reference to FIGS. 7 and 9. Elements or operations overlapping with those described above with reference to the semiconductor device of FIGS. 1 to 6 will be mentioned as briefly as possible or omitted for the sake of brevity.

Figure 7:
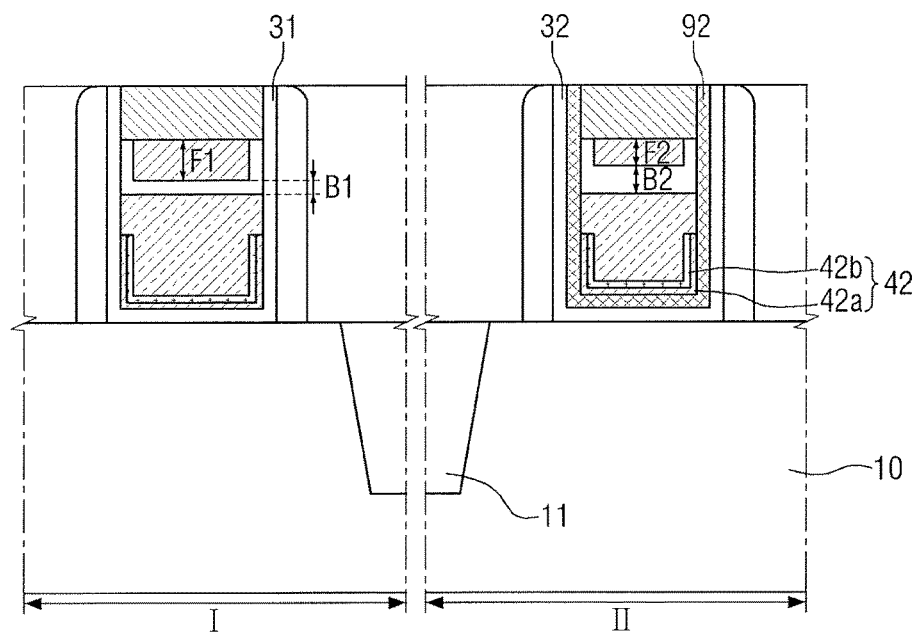
FIG. 7 illustrates a cross sectional view provided to explain a semiconductor device according to some example embodiments.
Figure 9:
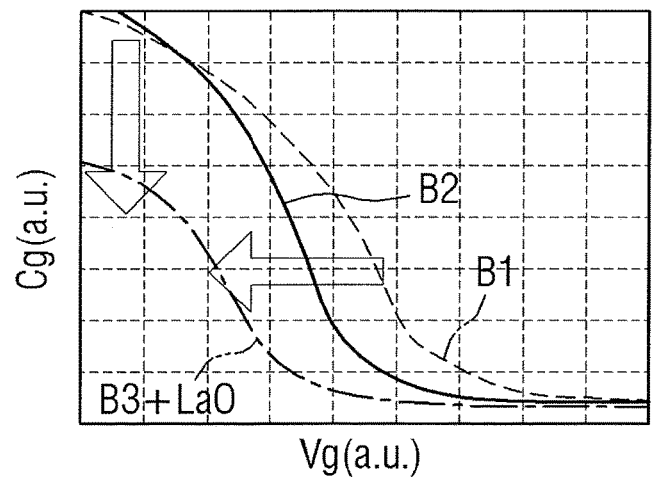
FIG. 9 illustrates a graphical representation provided to explain a semiconductor device according to some example embodiments.

FIG. 7 is a cross sectional view provided to explain a semiconductor device according to some example embodiments, and FIG. 9 is a graphical representation provided to explain a semiconductor device according to some example embodiments.

Referring to FIGS. 7 and 9, a first rare earth metal film 92 on the second high-k dielectric film 32 may be additionally included. The first rare earth metal film 92 may be formed conformally along the upper surface of the second high-k dielectric film 32. As illustrated in FIG. 7, the second liner pattern 42, the second work function metal 52, the second barrier metal 62, the second fill metal 72 and the second capping pattern 82 may be formed.

The first rare earth metal film 92 may include one or more of, for example, LaO, $Y_2O_3$, or LaSiO. Referring to the graphical representation of FIG. 9, B3+LaO represents a transistor added with the first rare earth metal film 92. Adding the first rare earth metal film 92 may help to additionally adjust the threshold voltage.

The semiconductor device according to example embodiments may be formed with increased accuracy, since it may be possible to adjust the threshold voltage not only based on the thickness of the barrier metals 61, 62, but also depending on presence and absence of the first rare earth metal film 92.

Hereinbelow, some example embodiments will be described with reference to FIGS. 8 and 9. Elements or operations overlapping with those described above with reference to the semiconductor device of FIGS. 1 to 7 will be mentioned as briefly as possible or omitted for the sake of brevity.

Figure 8:
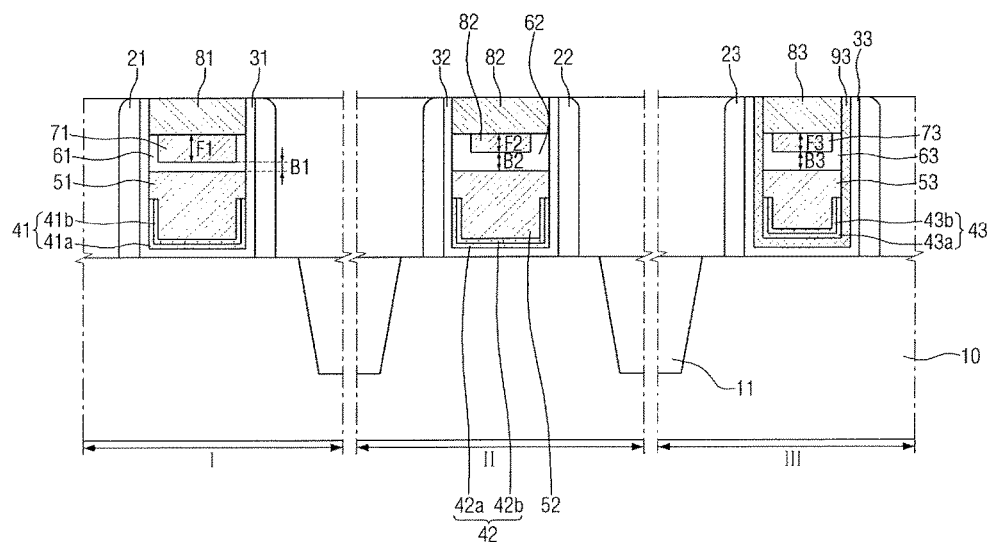
FIG. 8 illustrates a cross sectional view provided to explain a semiconductor device according to some example embodiments.

FIG. 8 is a cross sectional view provided to explain a semiconductor device according to some example embodiments.

Referring to FIGS. 8 and 9, the substrate 10 includes a first through a third regions I-III. The first region I and the second region II may not have the second rare earth metal film 93 present therein, while the third region III may have the second rare earth metal film 93 present therein.

The first region I may have the first liner pattern 41, the first work function metal 51, the first barrier metal 61, the first fill metal 71 and the first capping pattern 81 formed therein, and the second region II may have the second liner pattern 42, the second work function metal 52, the second barrier metal 62, the second fill metal 72 and the second capping pattern 82 formed therein. The third region III may have a third liner pattern 43, for example including layers 43a and 43b, a third work function metal 53, a third barrier metal 63, a third fill metal 73, a third capping patterns 83, and a second rare earth metal film 93.

In this case, the thickness B1 of the first barrier metal 61, the thickness B2 of the second barrier metal 62, and the thickness B3 of the third barrier metals 61, 62, 63 may be different from, or same as one another. Further, the thickness F1 of the first fill metal 71, the thickness F2 of the second fill metal 72, and the thickness F3 of the third fill metals 73 may also be different from, or same as one another.

Referring to FIG. 9, voltage capacitance curves of the transistors each including the barrier metals 61-63 having thicknesses B1, B2, and B3, respectively, and the second rare earth metal film 93, are shown. Accordingly, it can be confirmed that, as the thicknesses B1, B2, B3 of the barrier metals 61, 62, 63 become thicker and when there is the second rare earth metal film 93 present, the threshold voltage may increase (i.e., in the example of PFET).

Hereinbelow, a method for fabricating a semiconductor device according to some example embodiments will be explained with reference to FIGS. 1 and 10 to 21. Elements or operations of the semiconductor device overlapping with those described above will be mentioned as briefly as possible or omitted for the sake of brevity.

FIGS. 10 to 21 are views illustrating intermediate stages of fabrication, provided to explain a method for fabricating a semiconductor device according to some example embodiments.

Figure 10:
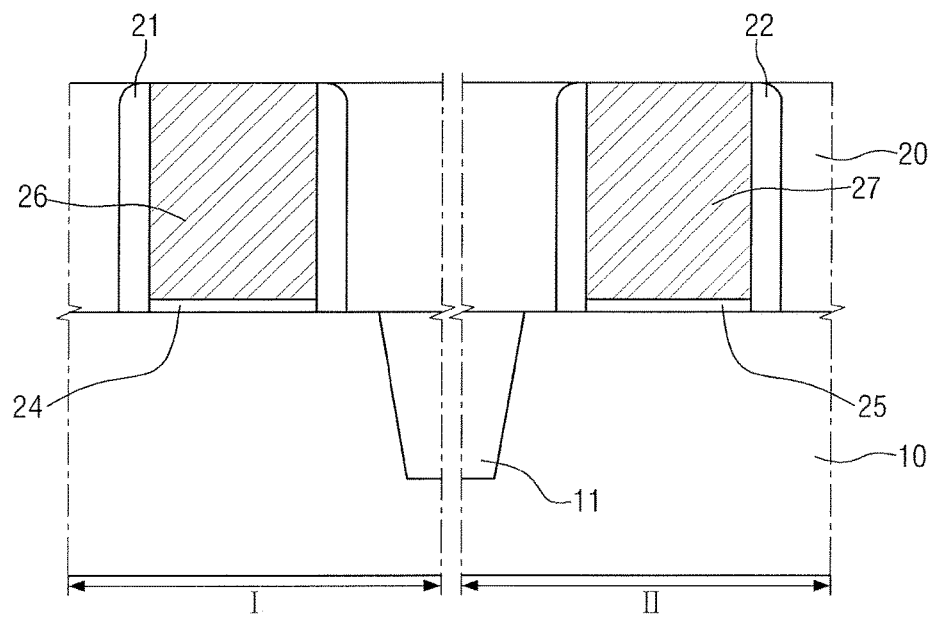
FIGS. 10 to 21 illustrate views illustrating intermediate stages of fabrication, provided to explain a method for fabricating a semiconductor device according to some example embodiments.

Referring to FIG. 10, dummy gate insulating films 24, 25 and dummy gate electrodes 26, 27 are formed on the substrate 10.

The substrate 10 may include a first region I and a second region II. The first region I may have the first trench T1, the first spacer 21, the first dummy gate insulating film 24, and the first dummy gate electrode 26 formed therein. The second region II may have the second trench T2, the second spacer 22, the second dummy gate insulating film 25, and the second dummy gate electrode 27 formed therein.

The dummy gate insulating films 24, 25 may be formed along the bottom surfaces of the first trench T1 and the second trench T2. The dummy gate electrodes 26, 27 may entirely fill the first trench T1 and the second trench T2, respectively.

Figure 11:
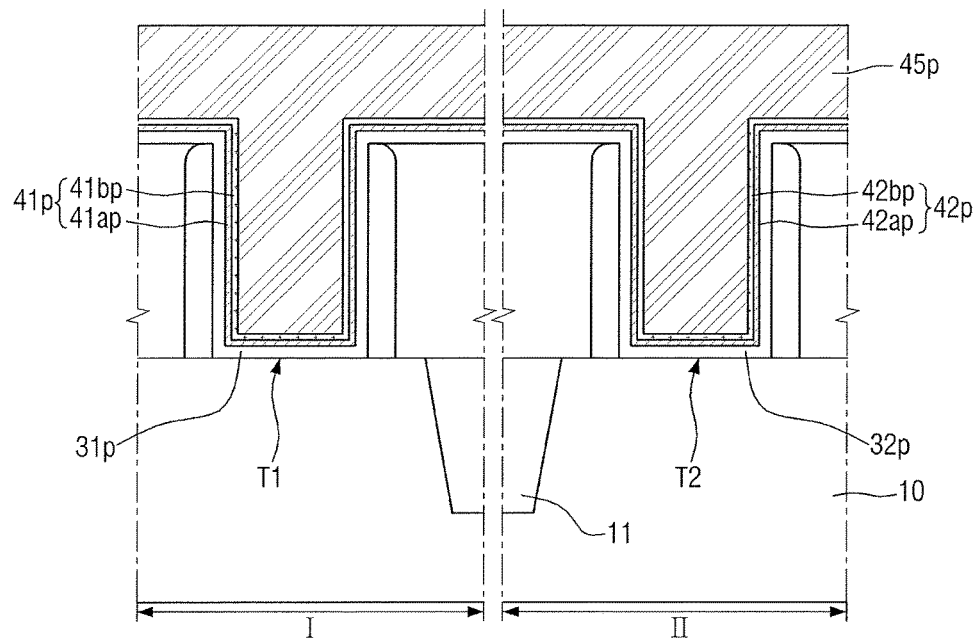

Next, referring to FIG. 11, the dummy gate electrodes 26, 27 and the dummy gate insulating films 24, 25 are removed, and pre high-k dielectric films 31p, 32p, liner films 41p, 42p (which may respectively include layers 41 by and 41ap, and 42bp and 42ap) and a filling film 45p are formed.

The pre high-k dielectric films 31p, 32p may be formed conformally along the bottom surfaces and the side surfaces of the first trench T1 and the second trench T2, and along the upper surface of the interlayer insulation film 20. The liner films 41p, 42p may be formed along the upper surfaces of the pre high-k dielectric films 31p, 32p. The filling film 45P may entirely fill the first trench T1 and the second trench T2.

Figure 12:
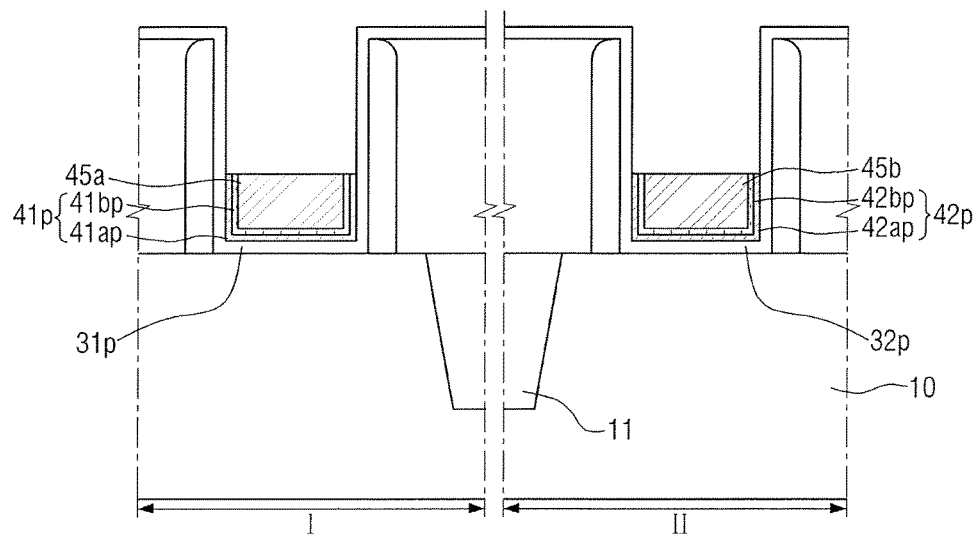

Next, referring to FIG. 12, the liner patterns 41p, 42p and filling patterns 45a, 45b are formed by partially removing the liner films 41p, 42p and the filling film 45p.

The uppermost portions of the upper surfaces of the liner patterns 41p, 42p and the upper surfaces of the filling patterns 45a, 45b may be at a same level. As illustrated, the liner patterns 41p, 42p and the filling patterns 45a, 45b may partially fill the first trench T1 and the second trench T2.

Figure 13:
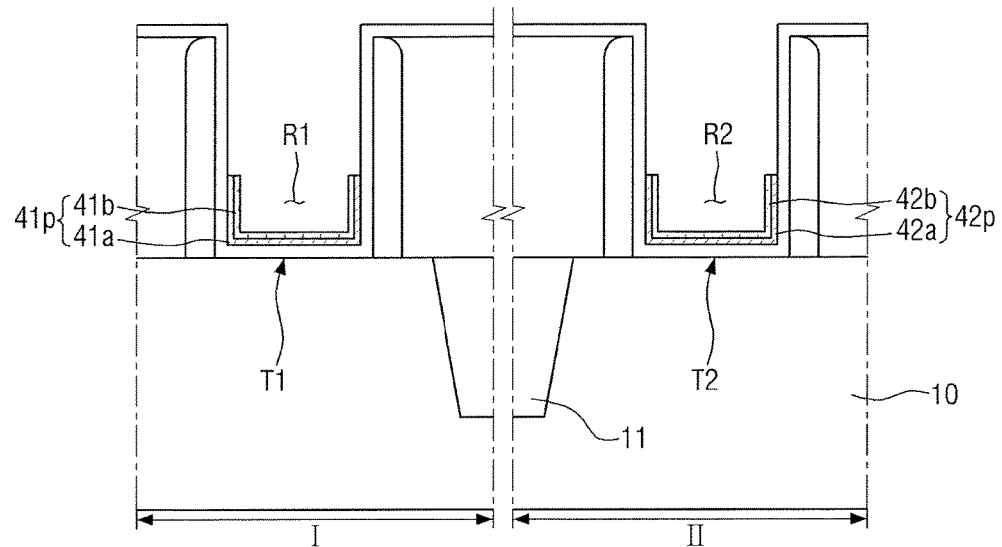

Next, referring to FIG. 13, a first recess R1 and a second recess R2 are formed by removing the filling patterns 45a, 45b.

The first recess R1 may be formed by removing the filling pattern 45a in the first trench T1. Further, the second recess R2 may be formed by removing the filling pattern 45b in the second trench T2.

Figure 14:
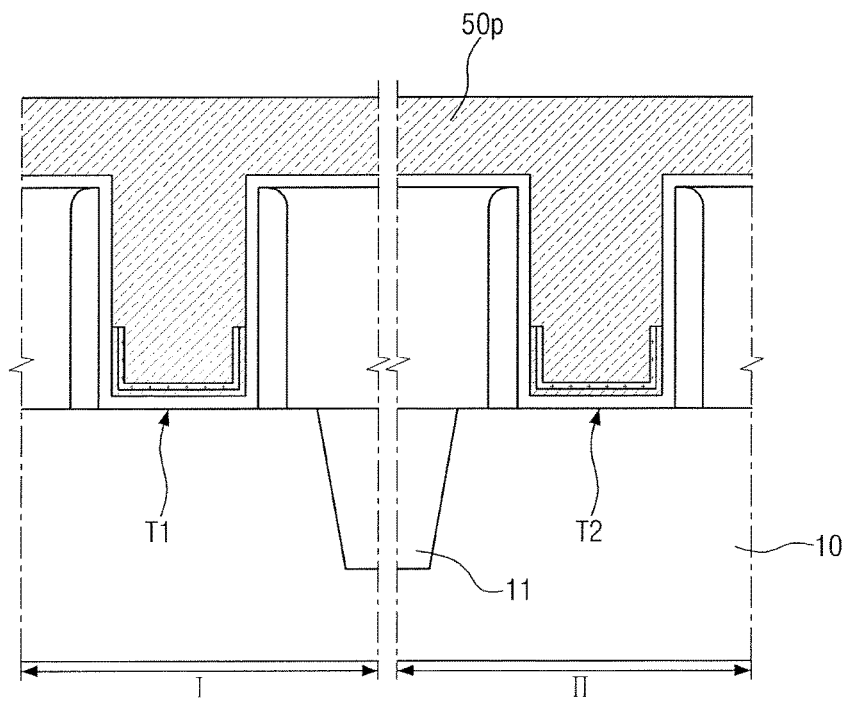

Next, referring to FIG. 14, a pre work function metal 50p is formed so as to fill the first trench T1 and the second trench T2.

The pre work function metal 50p may be formed so as to fill the first trench T1 and the second trench T2, and to cover the upper surfaces of the pre high-k dielectric films 31p, 32p outside the first trench T1 and the second trench T2.

Figure 15:
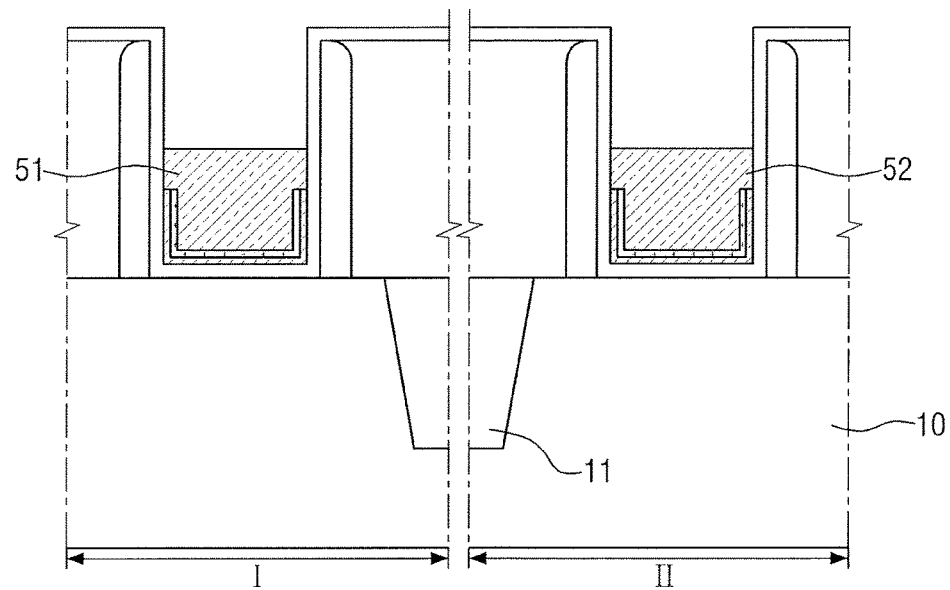

Next, referring to FIG. 15, the work function metals 51, 52 are formed by partially removing the pre work function metal 50p.

The first work function metal 51 may be formed in the first trench T1, and the second work function metal 52 may be formed in the second trench T2. The upper surfaces of the work function metals 51, 52 may be higher than the upper surfaces of the liner patterns 41, 42. The work function metals 51, 52 may partially fill the first trench T1 and the second trench T2.

Figure 16:
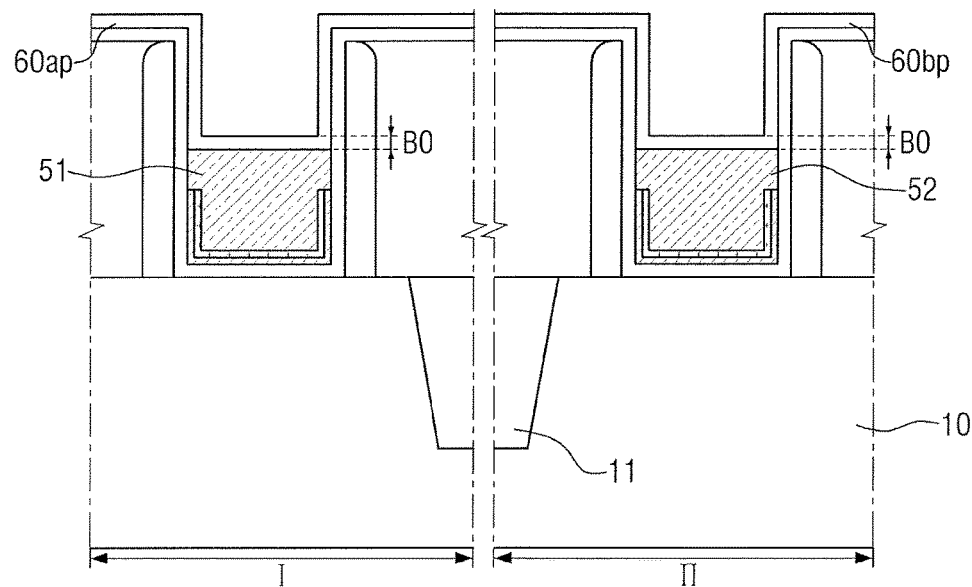

Next, referring to FIG. 16, first pre barrier metals 60ap, 60bp are formed.

The first pre barrier metals 60ap, 60bp may be formed in the first trench T1 and the second trench T2, conformally along the upper surfaces of the work function metals 51, 52 and along the sidewalls of the first trench T1 and the second trench T2. Further, the first pre barrier metals 60ap, 60bp may also be formed on the interlayer insulation film 20 outside the first trench T1 and the second trench T2. In this case, the thickness B0 of the first pre barrier metals 60ap, 60bp may be same in the first region I and the second region II.

The first pre barrier metals 60ap, 60bp may be formed by, for example, one or more of atomic layer deposition (ALD), chemical vapor deposition (CVD), physical vapor deposition (PVD), or low pressure chemical vapor deposition (LPCVD), but not limited thereto.

Figure 17:
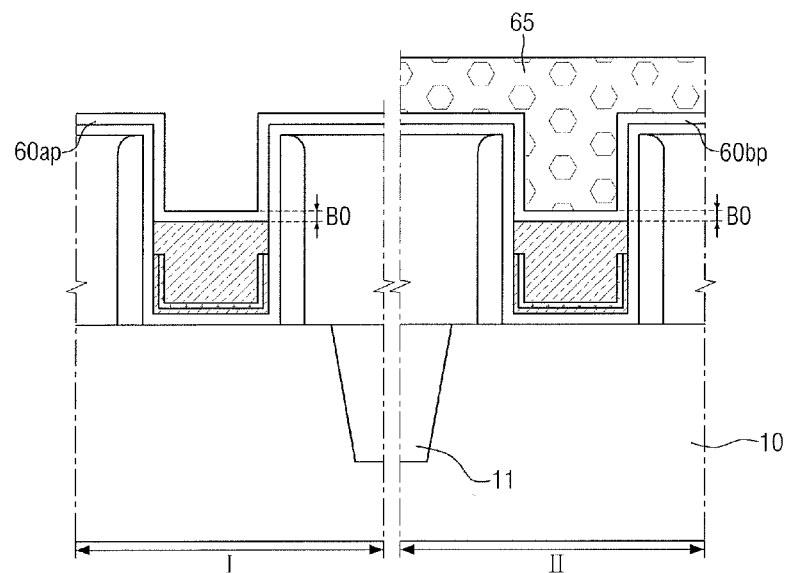

Next, referring to FIG. 17, a barrier film 65 is formed in the second region II.

The barrier film 65 may cover the first pre barrier metals 60ap, 60bp in the second region II, but may expose the first pre barrier metals 60ap, 60bp in the first region I. The barrier film 65 may be patterned by, for example, a photo resist, and so on.

Figure 18:
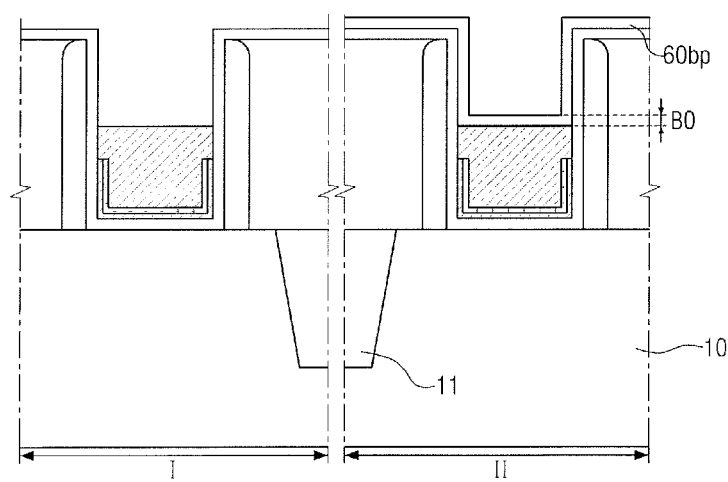

Next, referring to FIG. 18, from the first region I, the first pre barrier metals 60ap, 60bp are removed, and the barrier film 65 is removed from the second region II.

As a result, the first work function metal 51 may be exposed in the first region I. In contrast, in the second region IL where there still remains the first pre barrier metal 60bp, the second work function metal 52 may not be exposed.

Figure 19:
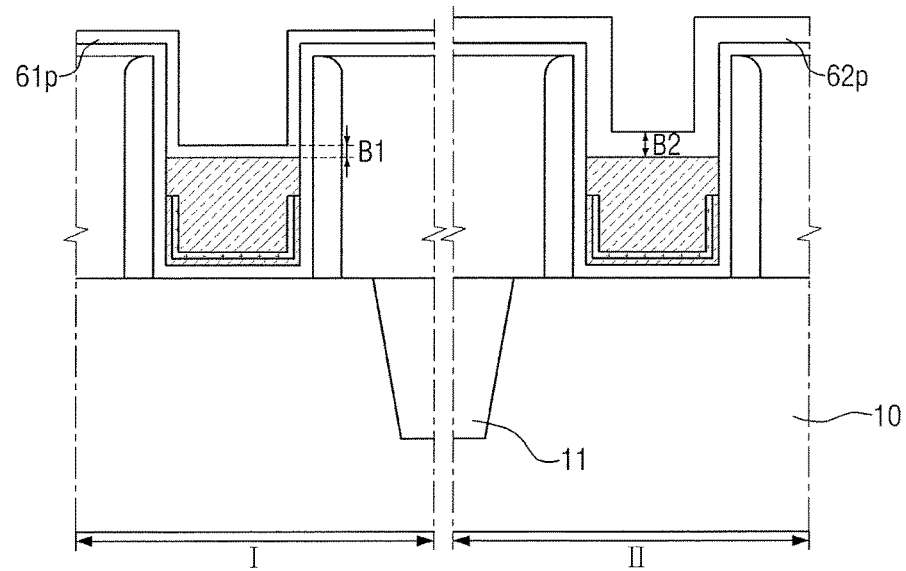

Next, referring to FIG. 19, second pre harrier metals 61p, 62p are formed.

The second pre barrier metals 61p, 62p may be formed by additionally depositing the pre barrier metal on the remaining first pre barrier metal 60bp. As a result, the second pre barrier metals 61p, 62p may have a thickness B1 in the first region and a thickness B2 in the second region II which are different from each other.

Figure 20:
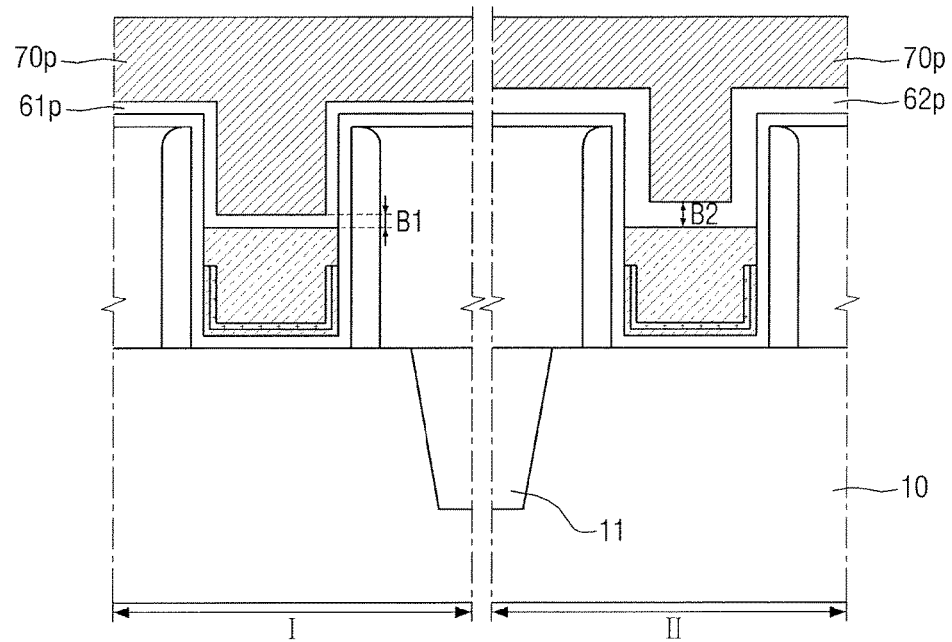

Next, referring to FIG. 20, a pre fill metal 70p is formed.

The pre fill metal 70p may entirely fill the first trench T1 and the second trench T2. The pre fill metal 70p may be formed on the second pre barrier metals 61p, 62p. Because the thickness of the second pre barrier metals 61p, 62p varies in the first trench T1 and the second trench T2, the pre fill metal 70p may also have different area or volume in the first trench T1 and the second trench T2.

Figure 21:
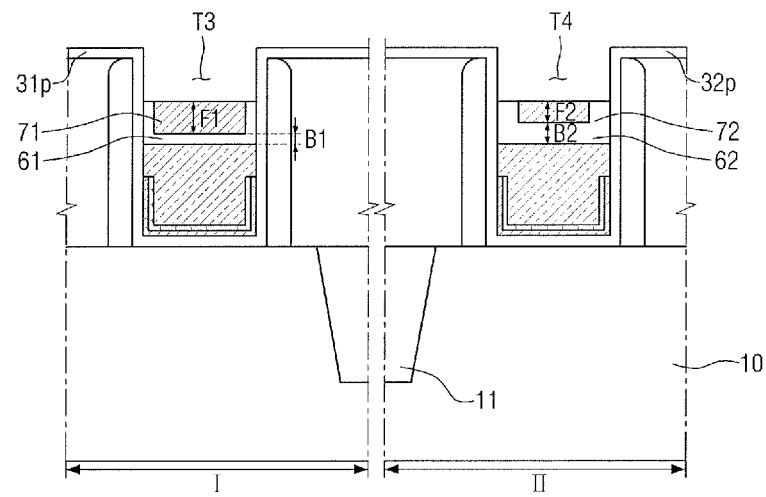

Next, referring to FIG. 21, the barrier metals 61, 62 and the fill metals 71, 72 are formed by partially removing the second pre barrier metals 61p, 62p and the pre fill metal 70p.

The barrier metals 61, 62 and the fill metals 71, 72 may not entirely fill the first trench T1 and the second trench T2. Accordingly, a third trench T3 may be formed in the first trench T1, and a fourth trench T4 may be formed in the second trench T2.

Next, referring to FIG. 1, capping patterns 81, 82 are formed, filling (for example, completely filling) the third trench T3 and the fourth trench T4. Accordingly, the first trench T1 and the second trench T2 may be entirely filled.

Hereinbelow, a method for fabricating a semiconductor device according to some example embodiments will be explained with reference to FIGS. 5, 10, 22, and 23. In the following description, those overlapped with the semiconductor devices and the method for fabricating a semiconductor device already described above will not be described or described as brief as possible for the sake of brevity.

Figure 22:
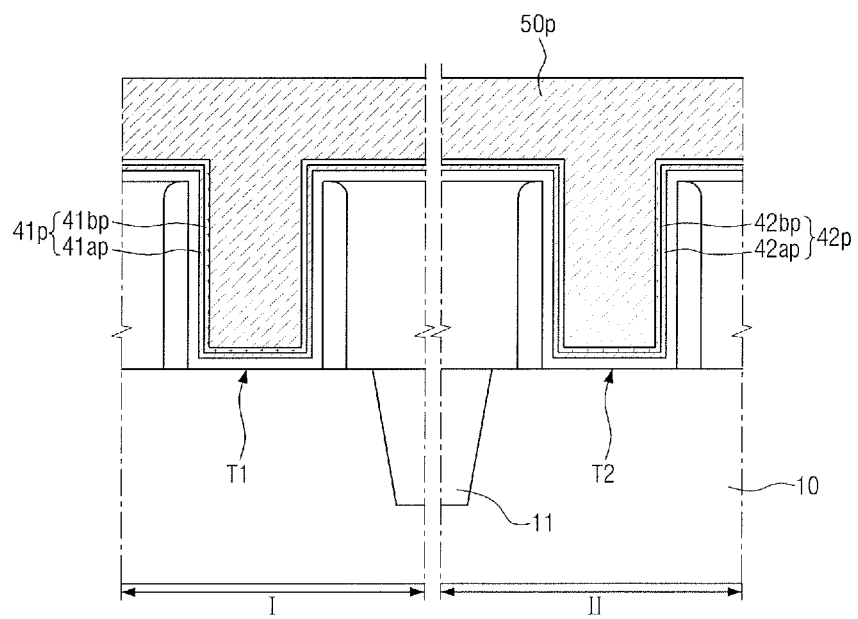
FIGS. 22 and 23 illustrate views illustrating intermediate stages of fabrication, provided to explain a method for fabricating a semiconductor device according to some example embodiments.
Figure 23:
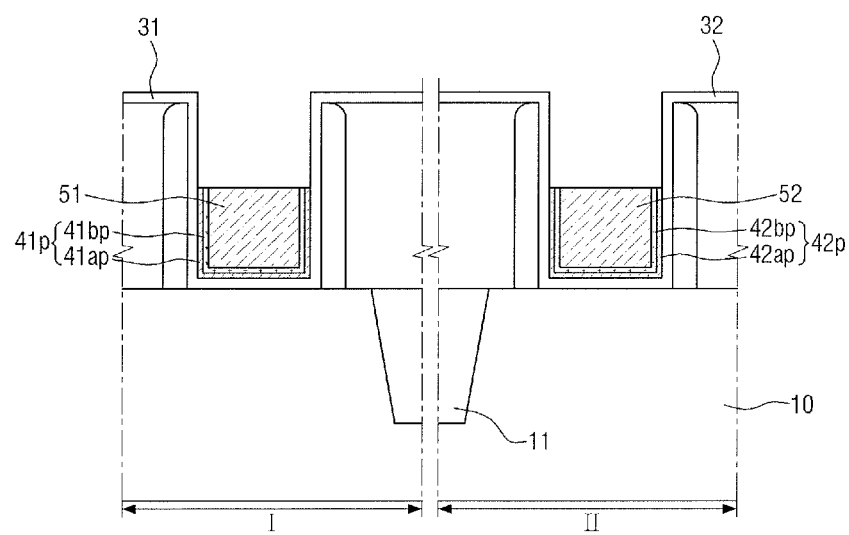

FIGS. 22 and 23 are views illustrating intermediate stages of fabrication, provided to explain a method for fabricating a semiconductor device according to some example embodiments.

The following description only refers to FIG. 22 and the description as to FIG. 10 will be omitted as this is identical to that already provided above. Referring to FIG. 22, the dummy gate electrodes 26, 27 and the dummy gate insulating films 24, 25 are removed, and pre high-k dielectric films 31, 32, liner films 41p, 42p and the pre work function metal 50p are formed.

The pre high-k dielectric films 31, 32 may be formed conformally along the bottom surfaces and the side surfaces of the first trench T1 and the second trench T2, and along the upper surface of the interlayer insulation film 20. The liner films 41p, 42p may be formed along the upper surfaces of the pre high-k dielectric films 31, 32. The pre work function metal 50p may entirely fill the first trench T1 and the second trench T2.

Next, referring to FIG. 23, the liner patterns 41p, 42p and the work function metals 51, 52 are formed by partially removing the liner films 41p, 42p and the pre work function metal 50p.

The liner patterns 41p, 42p and the work function metals 51, 52 may be patterned at once, and thus have the same level of exposed upper surfaces. The liner patterns 41p, 42p and the work function metals 51, 52 may partially fill the first trench T1 and the second trench T2.

Next, referring to FIG. 5, the barrier metals 61, 62, the fill metals 71, 72 and the capping patterns 81, 82 are formed in sequence.

The method for fabricating a semiconductor device according to example embodiments performs patterning process at once inside the trenches, and thus reduces damage to the high-k dielectric films 31, 32 and waste in the processing. As a result, maximized fabricating process efficiency can be provided.

Figure 24:
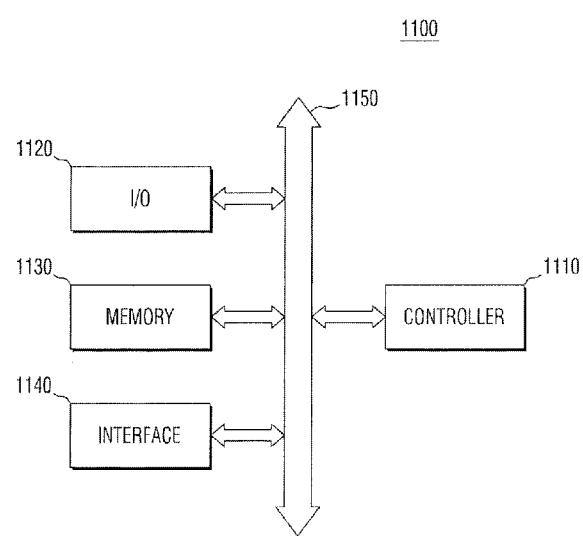
FIG. 24 illustrates a block diagram of an electronic system including a semiconductor device according to some example embodiments.

FIG. 24 is a block diagram of an electronic system including a semiconductor device according to some example embodiments.

Referring to FIG. 24, an electronic system 1100 according to example embodiments may include a controller 1110, an input/output (I/O) device 1120, a memory device 1130, an interface 1140 and a bus 1150. The controller 1110, the I/O device 1120, the memory device 1130 and/or the interface 1140 may be connected with one another via the bus 1150. The bus 1150 corresponds to a path through which data travels.

The controller 1110 may include one or more of, for example, a microprocessor, a digital signal processor, a micro controller, or logic devices capable of performing functions similar to the functions of those mentioned above. The I/O device 1120 may include a keypad, a keyboard, a display device and so on. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver. Although not illustrated, the electronic system 1100 may additionally include an operation memory configured to enhance operation of the controller 1110, such as a high-speed dynamic random-access memory (DRAM) and/or a static random access memory (SRAM). A fin field-effect transistor (FET) according to example embodiments may be provided within the memory device 1130, or provided as a part of the controller 1110 or the I/O device 1120.

The electronic system 1100 is applicable to, for example, a personal digital assistant (PDA) portable computer, a web tablet, a wireless phone, a mobile phone, a digital music player, a memory card, or other electronic products, for example, devices that are capable of transmitting and/or receiving data in wireless environment.

As described above, embodiments may provide a semiconductor device capable of reducing damage to a gate electrode structure and adjusting threshold voltage (Vth) with accuracy.

Embodiments may also provide a method for fabricating a semiconductor device, in which the method may reduce damage to a gate electrode structure and allow for adjusting threshold voltage (Vth) with accuracy.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a first trench and a second trench on the substrate;
a liner pattern along a portion of side surfaces and along bottom surfaces of the first and the second trenches, respectively, a lower surface of the liner pattern being higher than an upper surface of the substrate;
a work function metal in the first and the second trenches and on the liner pattern, respectively;
a first barrier metal in the first trench and on the work function metal, and having a first thickness;
a second barrier metal in the second trench and on the work function metal, and having a second thickness thicker than the first thickness;
a first fill metal on the first barrier metal; and
a second fill metal on the second barrier metal, wherein:
the work function metal in the second trench has a first portion having a first width and a second portion having a second width greater than the first width, the second portion separating the liner pattern in the second trench from the second barrier metal in a height direction of the second trench such that the liner pattern is entirely below the second barrier metal in the height direction of the second trench, and
the second barrier metal separates the second fill metal from the work function metal in the second trench in the height direction of the second trench such that the work function metal is entirely below the second fill metal in the height direction.

2. The semiconductor device as claimed in claim 1, further comprising a first recess within the first barrier metal, wherein the first fill metal fills the first recess.

3. The semiconductor device as claimed in claim 2, further comprising a second recess within the second barrier metal, the second fill metal filling the second recess.

4. The semiconductor device as claimed in claim 3, wherein a width of the first recess is wider than a width of the second recess.

5. The semiconductor device as claimed in claim 3, wherein a depth of the first recess is greater than a depth of the second recess.

6. The semiconductor device as claimed in claim 1, further comprising:
a first capping pattern on the first barrier metal and filling the first trench; and
a second capping pattern on the second barrier metal and filling the second trench.

7. The semiconductor device as claimed in claim 1, further comprising a high-k dielectric film in the first and the second trenches and under the liner pattern.

8. The semiconductor device as claimed in claim 7, wherein, in the first trench, the high-k dielectric film contacts the liner pattern and the first barrier metal.

9. The semiconductor device as claimed in claim 7, wherein the high-k dielectric film contacts the work function metal.

10. The semiconductor device as claimed in claim 7, wherein, in the first trench, the high-k dielectric film does not contact the first fill metal.

11. The semiconductor device as claimed in claim 7, further comprising a rare earth metal film between the liner pattern and the high-k dielectric film.

12. The semiconductor device as claimed in claim 11, wherein the rare earth metal film includes one or more of LaO, $Y_2O_3$, or LaSiO.

13. The semiconductor device as claimed in claim 1, wherein the liner pattern includes a lower liner pattern, and an upper liner pattern on the lower liner pattern.

14. A semiconductor device, comprising:
a substrate;
a first trench and a second trench on the substrate;
a liner pattern along a portion of side surfaces and along bottom surfaces of the first and the second trenches, respectively, a lower surface of the liner pattern being higher than an upper surface of the substrate;
a work function metal in the first and the second trenches and on the liner pattern, respectively;
a barrier metal in the first and the second trenches and on the work function metal; and
a fill metal on the barrier metal, wherein:
the work function metal in the second trench has a first portion having a first width and a second portion having a second width greater than the first width, the second portion separating the liner pattern in the second trench from the barrier metal in the second trench in a height direction of the second trench such that the liner pattern in the second trench is entirely below the barrier metal in the second trench in a height direction of the second trench,
the barrier metal in the second trench separates the fill metal from the work function metal in the height direction of the second trench such that the work function metal is entirely below the fill metal in the height direction, and
a volume of the fill metal in the first trench is greater than a volume of the fill metal in the second trench.

15. The semiconductor device as claimed in claim 14, wherein the barrier metal and the fill metal in the first trench combined have a first volume, the barrier metal and the fill metal in the second trench combined have a second volume, and the first volume is equal to the second volume.

16. The semiconductor device as claimed in claim 14, wherein the fill metal includes a first fill metal in the first trench and a second fill metal in the second trench, a width of the first fill metal being greater than a width of the second fill metal.

17. The semiconductor device as claimed in claim 14, wherein the fill metal includes a first fill metal in the first trench and a second fill metal located in the second trench, a height of the first fill metal being greater than a height of the second fill metal.

18. The semiconductor device as claimed in claim 14, wherein the barrier metal includes one or more of Ti or Ta.

19. A semiconductor device, comprising:
a first gate and a second gate adjacent to one another on a substrate, wherein:
the first gate includes a first liner pattern in a U-shape, a first work function metal in a T-shape on the first liner pattern, a first barrier metal on the first work function metal and having a lower surface higher than an upper surface of the first liner pattern, and a first fill metal on the first barrier metal,
the second gate includes a second liner pattern in a U-shape, a second work function metal in a T-shape on the second liner pattern, and a second barrier metal on the second work function metal and having a lower surface higher than an upper surface of the second liner pattern and higher than an upper surface of the second work function metal, and
a lower surface of the first liner pattern and a lower surface of the second liner pattern are higher than an upper surface of the substrate.

\* \* \* \* \*